(12) United States Patent
Moens et al.

(10) Patent No.: US 11,335,798 B2
(45) Date of Patent: May 17, 2022

(54) ENHANCEMENT MODE MISHEMT WITH GAN CHANNEL REGROWTH UNDER A GATE AREA

(71) Applicant: SEMICONDUCTOR COMPONENTS INDUSTRIES, LLC, Phoenix, AZ (US)

(72) Inventors: Peter Moens, Erwetegem (BE); Piet Vanmeerbeek, Sleidinge (BE); Abhishek Banerjee, Kruibeke (BE); Marnix Tack, Merelbeke (BE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/734,649

(22) Filed: Jan. 6, 2020

(65) Prior Publication Data

US 2021/0210627 A1  Jul. 8, 2021

(51) Int. Cl.
*H01L 29/778* (2006.01)
*H01L 29/423* (2006.01)
*H01L 29/51* (2006.01)
*H01L 29/66* (2006.01)
*H01L 29/10* (2006.01)

(52) U.S. Cl.
CPC ...... *H01L 29/7786* (2013.01); *H01L 29/1037* (2013.01); *H01L 29/4236* (2013.01); *H01L 29/513* (2013.01); *H01L 29/66431* (2013.01)

(58) Field of Classification Search
CPC ............ H01L 29/7786; H01L 29/1037; H01L 29/513; H01L 29/66431; H01L 29/4236
See application file for complete search history.

(56) References Cited

U.S. PATENT DOCUMENTS

| | | | |
|---|---|---|---|
| 2009/0146185 A1* | 6/2009 | Suh | H01L 29/7781 257/194 |
| 2009/0267078 A1 | 10/2009 | Mishra et al. | |
| 2017/0345921 A1* | 11/2017 | Feng | H01L 29/7786 |
| 2017/0365671 A1* | 12/2017 | Nakano | H01L 29/66462 |
| 2021/0118984 A1* | 4/2021 | Shimizu | H01L 29/2003 |

OTHER PUBLICATIONS

Ming Tao et al., "Kilovolt GaN MOSHEMT on Silicon Substrate with Breakdown Electric Field Close to the Theoretical Limit," Proceedings of the 29th International Symposium on Power Semiconductor Devices & ICs, Sapporo, 2017.

(Continued)

*Primary Examiner* — Mohammed R Alam
(74) *Attorney, Agent, or Firm* — Brake Hughes Bellermann LLP

(57) ABSTRACT

An Enhancement Mode (e-mode) Metal Insulator Semiconductor (MIS) High Electron Mobility Transistor (HEMT), or EMISHEMT, with GaN channel regrowth under a gate area, is described. The EMISHEMT with GaN channel regrowth under a gate area provides a normally-off device with a suitably high and stable threshold voltage, while providing a low gate leakage current. A channel layer provides a 2DEG and associated low on-resistance, while a channel-material layer extends through an etched recess and into the channel layer, and disrupts the 2DEG locally to enable the normally-off operation.

16 Claims, 10 Drawing Sheets

(56) References Cited

OTHER PUBLICATIONS

Mengyuan Hua et al., "High-Performance Fully-recessed Enhancement-Mode GaN MIS-FETs with Crystalline Oxide Interlayer," Proceedings of the 29th International Symposium on Power Semiconductor Devices & ICs, Sapporo, 2017.

Hideyuki Okita et al., "Through Recessed and Regrowth Gate Technology for Realizing Process Stability of GaN-GITs," Proceedings of the 2016 28th International Symposium on Power Semiconductor Devices and ICs (ISPSD), Jun. 12-16, 2016, Prague, Czech Republic.

P. Moens, et al., "An Industrial Process for 650V rated GaN-on-Si Power Devices using in-situ SiN as a Gate Dielectric," Proceedings of the 26th International Symposium on Power Semiconductor Devices & IC's, Jun. 15-19, 2014 Waikoloi, Hawaii.

Charles et al.; "III-N Epitaxy on Si for Power Electronics"; Chapter 4; Univ. Grenoble Alpes, CEA, LETI, Grenoble, France; 2018 Elsevier Ltd.; pp. 115-158.

\* cited by examiner

US 11,335,798 B2

ENHANCEMENT MODE MISHEMT WITH GaN CHANNEL REGROWTH UNDER A GATE AREA

TECHNICAL FIELD

This description relates to High Electron Mobility Transistors (HEMTs).

BACKGROUND

A HEMT is a type of transistor that utilizes a current channel formed using a heterojunction at a boundary between two materials having different band gaps. For example, a relatively wide band gap material such as AlGaN (Aluminum Gallium Nitride) may be doped with n-type impurities and used to form a junction with an undoped, relatively narrow band gap material, such as GaN (Gallium Nitride). Then, an equilibrium is reached in which the narrow band gap material has excess majority carriers that form a 2-dimensional electron gas (2DEG). Consequently, and because the narrow band gap material has no doping impurities to disrupt current flow through scattering, HEMT devices provide, among other advantages, very high switching speeds, high gains, and high power applications.

SUMMARY

According to one general aspect, a semiconductor device may comprise a High Electron Mobility Transistor (HEMT) having a channel layer and a barrier layer formed adjacent to the channel layer and extending at least partially between a source and a drain of the HEMT. The HEMT may include a channel-material layer extending through the barrier layer and into the channel layer, at least one dielectric layer formed adjacent to the channel-material layer, and a gate formed adjacent to the at least one dielectric layer.

According to another general aspect, A High Electron Mobility Transistor (HEMT) device may include a channel layer and a barrier layer adjacent to the channel layer and forming a heterojunction therewith, the heterojunction causing a two-dimensional electron gas (2DEG) to occur within the channel layer. The HEMT may include a channel-material layer formed at least partially within a recess in the barrier layer and including a portion that extends into the channel layer, at least one dielectric layer formed adjacent to the channel-material layer, and a gate formed adjacent to the at least one dielectric layer. A source and a drain formed at opposing ends of the 2DEG may define a current channel between the source and the drain that extends through the channel layer, where the current channel includes a region of the channel layer adjacent to the portion of the channel-material layer.

According to another general aspect, a method of making a High Electron Mobility Transistor (HEMT) includes forming a layer stack that includes at least a channel layer and a barrier layer adjacent to the channel layer and forming a heterojunction at which a current channel is defined in the channel layer, and forming a recess in the barrier layer that extends into the channel layer. The method may include forming a channel-material layer within the recess, and forming at least one dielectric layer adjacent to the channel-material layer. The method may include forming a gate adjacent to the at least one dielectric layer, and forming a source and drain at opposing ends of the current channel.

The details of one or more implementations are set forth in the accompanying drawings and the description below. Other features will be apparent from the description and drawings, and from the claims.

DETAILED DESCRIPTION

As described in detail below, embodiments include a semiconductor device including an Enhancement Mode (e-mode) Metal Insulator Semiconductor (MIS) High Electron Mobility Transistor (HEMT), or EMISHEMT, with GaN channel regrowth under a gate area. The EMISHEMT with GaN channel regrowth under a gate area provides a normally-off device with a suitably high and stable threshold voltage (Vt), while providing a low gate leakage current. A channel layer provides a 2DEG and associated low on-resistance (Ron), while a channel-material layer extends through an etched recess and into the channel layer, and disrupts the 2DEG locally to enable the normally-off operation. Even when the barrier layer undergoes etching to provide the channel-material layer (which may typically create excessive interface states at the etched recess), a low interface state density (Dit) and corresponding high channel mobility may be maintained.

In more detail, portions of a channel layer are adjacent to (e.g., form an interface with) a barrier layer, and therefore have a 2DEG formed therein. The channel-material layer extends through a recess (e.g., an etched recess) through the barrier layer and into the channel layer, and at least a portion of the channel-material layer extends into the channel layer. The portion of the channel-material layer that extends into the channel layer disrupts the 2DEG in an adjacent region of the channel layer (referred to herein as a disrupted 2DEG region).

At least one insulating dielectric may be formed adjacent to the channel-material layer, and a gate may be formed on the at least one dielectric. The resulting structure forms a normally-off device, so that when an appropriate voltage is applied at the gate, a current channel is formed through the 2DEG and through the disrupted 2DEG region of the channel layer, to thereby conduct current between a source and drain of the EMISHEMT with GaN channel regrowth under a gate area.

In general, due to the presence of the 2DEG referenced above, it is straightforward to form a 'normally-on' HEMT. However, particularly for high power applications, a 'normally-off' HEMT may be desired, and a number of modifications have been developed to enable normally-off HEMT devices. In general, normally-off HEMTs may have an improved safety profile in high power applications, and may simplify related drive circuitry. The EMISHEMT with GaN channel regrowth under a gate area described herein provides an E-mode HEMT that may be formed efficiently and reliably, and provides the advantages of E-mode HEMTs (e.g., high switching speeds), while minimizing or reducing drawbacks of existing E-mode HEMT devices.

Figure 1:
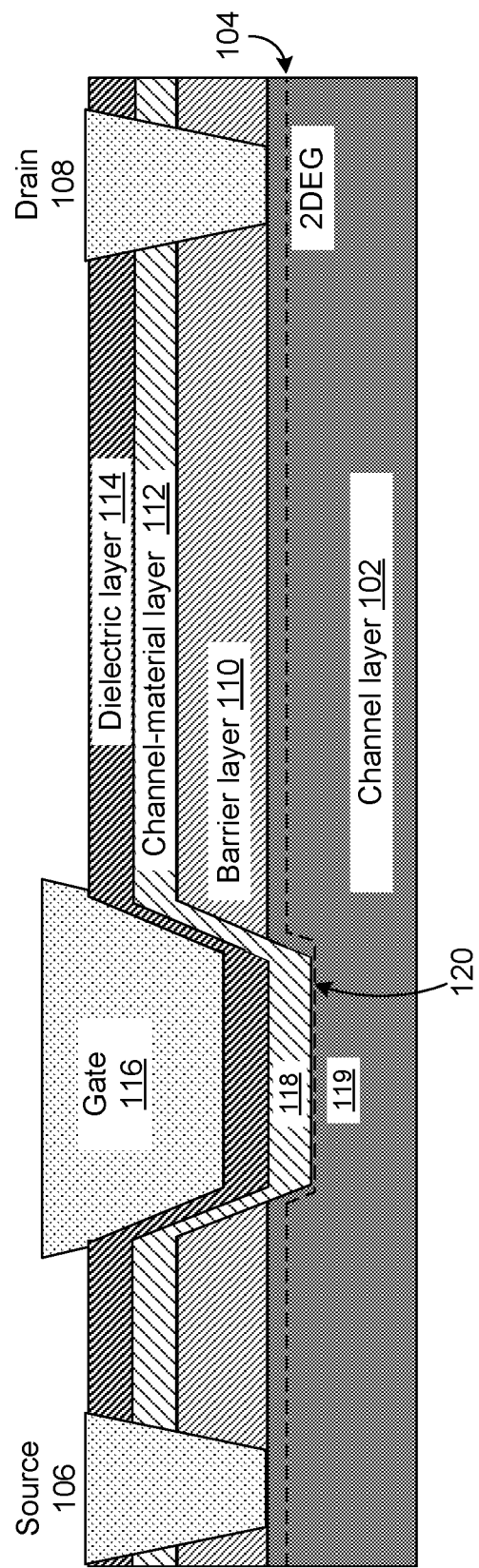
FIG. 1 shows a cross-section of an E-mode MISHEMT with GaN channel regrowth under a gate area, according to some example implementations.

In FIG. 1, an EMISHEMT with GaN channel regrowth under a gate area is illustrated with a channel layer 102 that has a 2DEG 104 formed at an interface with a barrier layer 110. The barrier layer 110 extends at least partially between a source 106 and a drain 108 at opposing ends of the 2DEG 104. During operation, current flow is thus defined between the source 106 and the drain 108, as described in more detail, below.

A channel-material layer 112 is adjacent to the barrier layer 110, and at least a portion of the channel-material layer 112 is formed within a recess in the barrier layer 110 that extends into the channel layer 102. The channel-material layer 112 may be formed using the same material as the channel layer, e.g., GaN, or variations thereof. For example, as described below, the channel-material layer 112 may be p-doped. At least one insulating dielectric layer 114 is formed on the channel-material layer 112, and a gate 116 is formed on the at least one insulating dielectric 114.

As referenced above, and as illustrated in FIG. 1, a portion 118 of the channel-material layer 112 extends at least partially into the channel layer 102. For example, a portion of the channel-material layer 112 is disposed above a top surface (or plane aligned along the top surface or interface) of the channel layer 102 and the portion 118 of the channel-material layer 112 is disposed below the top surface of the channel layer 102. The portion of the channel-material layer 112 disposed above the top surface of the channel layer 102 can be contiguous (via additional portions (e.g., sloped portions, connecting portions aligned with the gate 116 trench)) with the portion 118 of the channel-material layer 112 disposed below the top surface of the channel layer 102. Consequently, there is no interface between the channel layer 102 and the barrier layer 110, so that the 2DEG 104 is disrupted. As also referenced above, a region 119 of the channel layer that is adjacent to the portion 118 of the channel-material layer 112 may be referred to herein as a 2DEG disruption region 119, so that the EMISHEMT of FIG. 1 is normally-off in a default or unbiased state (e.g., $V_{gs}=0V$), but is turned on by application of a positive bias at the gate 116, which thereby allows source-drain current to flow through the 2DEG 104 and through a current channel 120 through the 2DEG disruption region 119.

Figure 2:
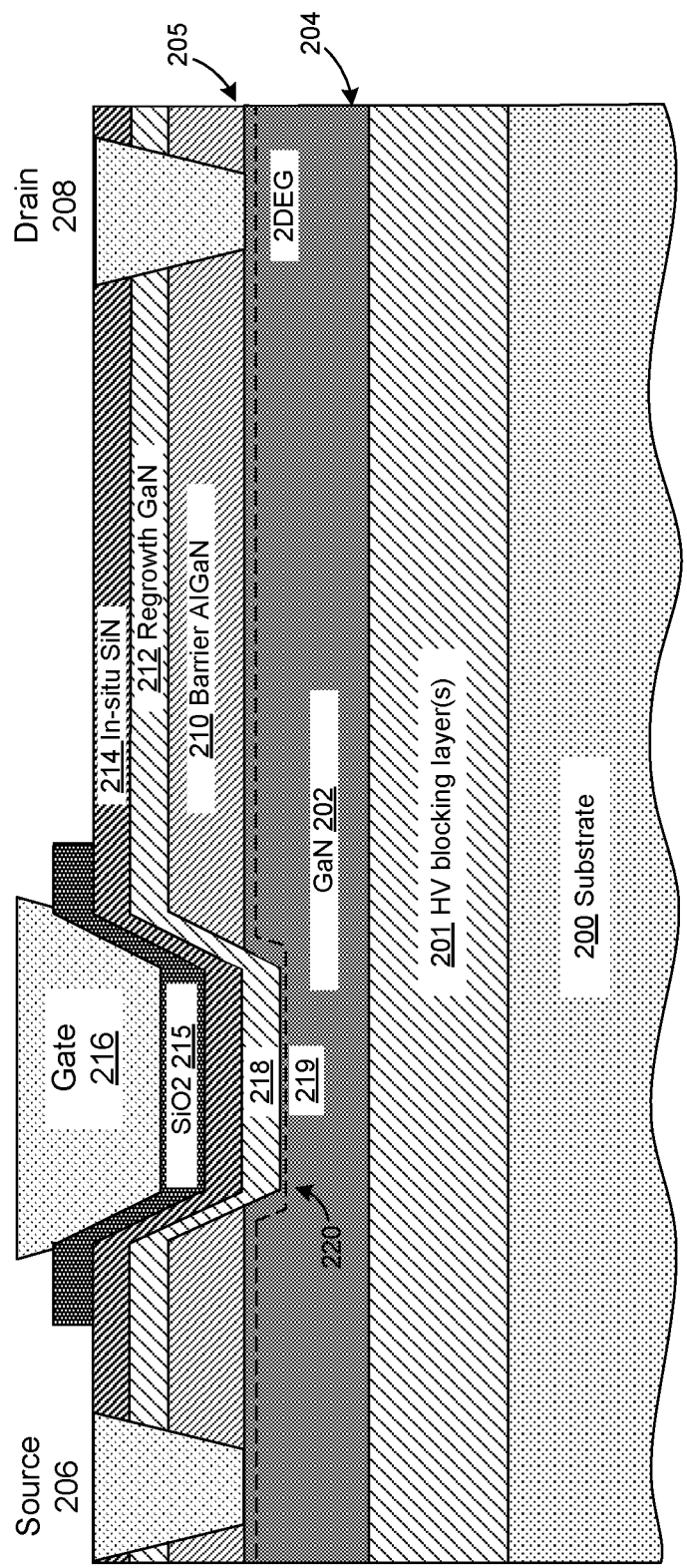
FIG. 2 illustrates a more detailed example device structure of the E-mode MISHEMT with GaN channel regrowth under a gate area of FIG. 1.

FIG. 2 illustrates a more detailed example device structure of the regrowth E-mode MISHEMT of FIG. 1. In the example of FIG. 2, a substrate 200 is illustrated, which may be, e.g., GaN, Si, Silicon Carbide (SiC), Aluminum Nitride (AlN), or Sapphire (e.g., monocrystalline $Al_2O_3$). Also in FIG. 4, a high voltage (HV) blocking layer 201 is illustrated that may be advantageous in scenarios in which the device of FIG. 2 is used in high voltage contexts. For example, the HV blocking layer 201 may include carbon-doped Gallium Nitride (GaN). By doping the GaN buffer layer 201 with Carbon or other suitable p-type material, the n-type nature of GaN is effectively counter-doped, so that the HV blocking layer 201 is more insulative and able to sustain high V.

Although not separately illustrated within FIG. 2, additional or alternative layers may be included. For example, a strain relief layer may be included, if needed to facilitate strain relief with respect to any lattice mismatch that may occur. For example, if the HV blocking layer 201 is not used, a strain relief layer might be included between the substrate 200 and a channel layer 202. For example, a GaN channel layer has a non-trivial lattice mismatch with a substrate 200 formed of Si. The resulting strain at the junction may be relieved, for example, by including GaN doped with a percentage of Al within an intervening strain relief layer.

Similarly to FIG. 1, the example EMISHEMT of FIG. 2 includes a channel layer 202 formed of GaN, with a 2DEG 204 formed therein at interfaces of the channel layer 202 with a barrier layer 210 formed of AlGaN. In FIG. 2, an etch stop layer 205 is illustrated that is used in example formation processes for the EMISHEMT device of FIG. 2, as described in more detail, below, with respect to FIGS. 4 and 5.

Also similar to FIG. 1, a portion 218 of the channel-material layer 212 extends into, and is adjacent to, the channel layer 202, thereby creating a disrupted 2DEG region 219. Accordingly, when a bias is applied at a gate 216, a current channel 220 through the disrupted 2DEG region 119, together with the 2DEG 204, enables current flow between a source 206 and a drain 208.

In the example of FIG. 2, the at least one dielectric layer 114 of FIG. 1 is implemented as a first dielectric layer 214 and a second dielectric layer 215. Specifically, the first dielectric layer 214 may be implemented as silicon nitride ($Si_3N_4$, referred to herein as SiN), and, as described in detail below with respect to FIG. 6, may be formed in-situ together with the channel-material layer 212. Such in-situ formation of the first dielectric layer 214 as SiN provides an extremely well-formed, high quality interface with the channel-material layer 212, as also described below.

The second dielectric layer 215 may be formed of any suitable insulating material, such as a suitable oxide material, including $SiO_2$ or an Aluminum Oxide, e.g., $Al_2O_3$. The illustrated combination of different insulating dielectric layers 214, 215 provides a number of potential features and advantages, as illustrated and described with respect to FIG. 3.

Figure 3:
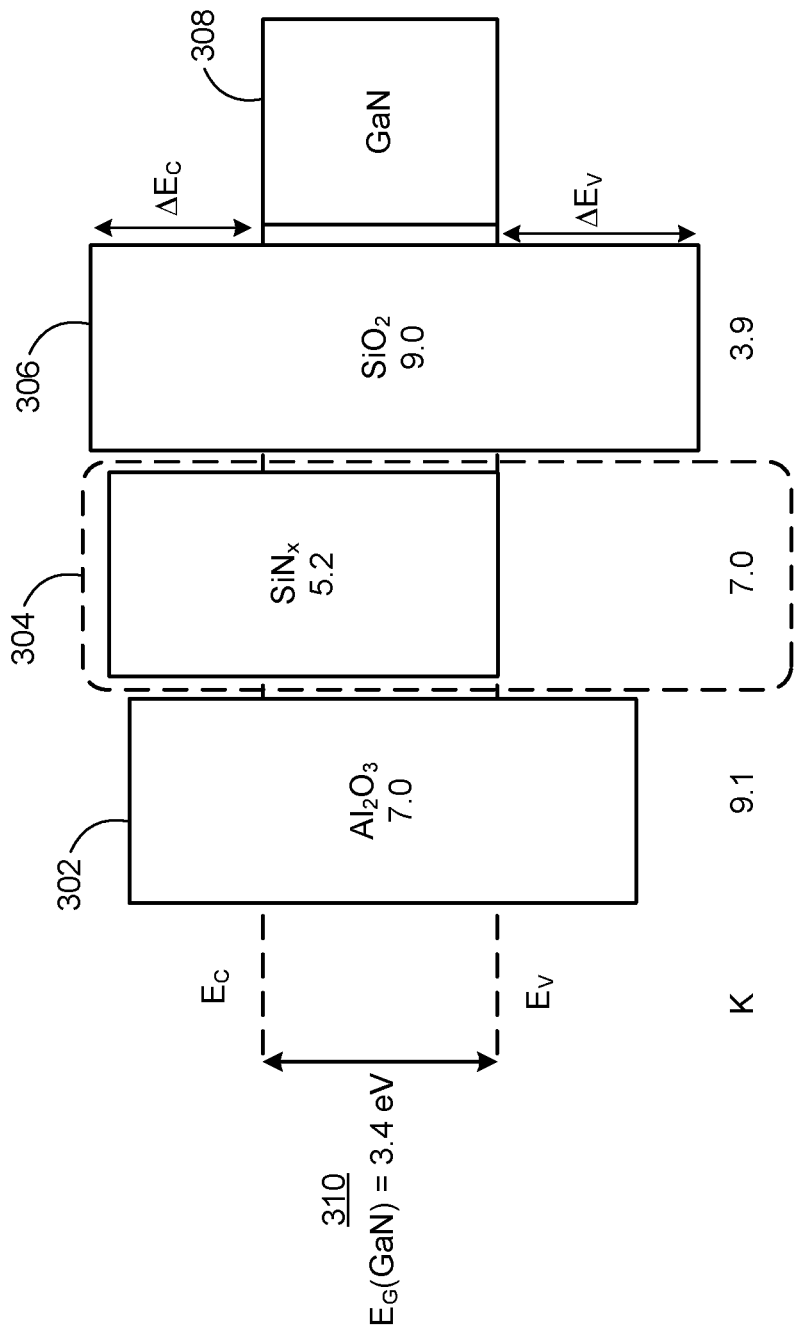
FIG. 3 illustrates bandgaps and bandgap offsets of example dielectric materials that may be used in the example devices of FIGS. 1 and 2.

Specifically, FIG. 3 illustrates bandgaps and bandgap offsets of example dielectric materials that may be used in the example devices of FIGS. 1 and 2. As shown, an example $Al_2O_3$ bandgap 302 may be 7.0 eV, while a SiN bandgap 304 may be 5.2 eV, and a $SiO_2$ bandgap 306 may be 9.0 eV. As also illustrated, an energy gap $E_G$ 310 of GaN 308 is 3.4 eV. FIG. 3 also illustrates the bandgaps 302, 304, 306, 308 relative to the conduction band ($E_C$) and valence band ($E_V$) of GaN, as well as the relative dielectric constants K of $Al_2O_3$ (9.1), SiN (7.0), and $SiO_2$ (3.9).

Therefore, as may be observed, SiN provides a suitable conduction band offset for conduction band electrons, but not for valence band electrons. As a result, holes that enter the SiN from the gate 216 may reach the GaN of the channel layers 202, 212.

On the other hand, both the $Al_2O_3$ and the $SiO_2$ have large band gaps for both electrons and holes, and for both conduction and valence bands. As a result, for example, holes from the gate 216 will be blocked.

Nonetheless, as also referenced, the SiN also provides features and advantages. For example, as referenced above and described in detail below, the channel-material layer 212 may be regrown following etching of the barrier layer 210. Such etching may lead to a large amount of interface states on the recessed barrier layer 210, which may reduce charge carrier mobility and may also contribute to instabilities in the device threshold voltage.

SiN minimizes or eliminates related concerns by providing surface passivation and low interface state density $D_{it}$ at the recessed surfaces of the barrier layer 210. These features and advantages are enhanced by the in-situ formation of the SiN 214 immediately following formation of the channel-material layer 212, which provides a high quality interface therebetween. Additional example aspects of such in-situ formation of the SiN layer 214 are illustrated and described below, with respect to FIG. 6.

FIGS. 4-8 illustrate first example intermediate device structures for forming an implementation of the E-mode MISHEMT with GaN channel regrowth of FIG. 1, in accordance with the example of FIG. 2. FIG. 9 is a flowchart illustrating example operations for forming an EMISHEMT in accordance with the example intermediate structures of FIGS. 4-8.

Figure 4:
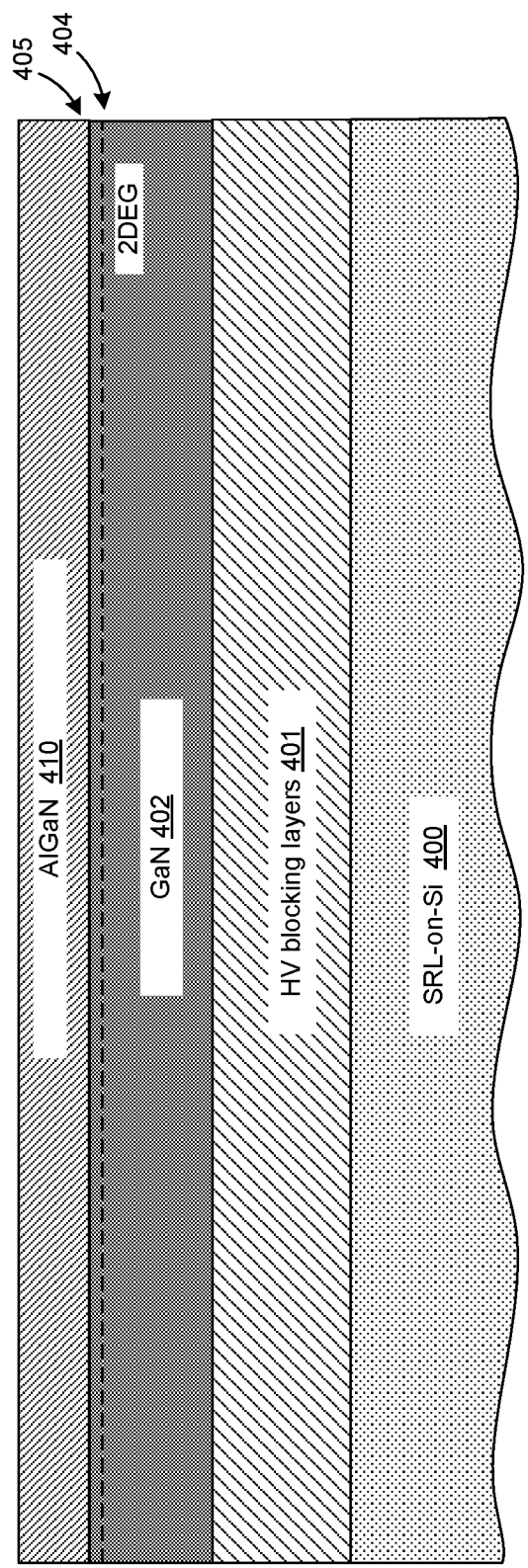
FIG. 4 illustrates a first example intermediate device structure for forming an implementation of the E-mode MISHEMT with GaN channel regrowth under a gate area of FIG. 1.

FIG. 4 illustrates a layer stack or wafer structure for an EMISHEMT that includes substrate 400, HV blocking layer(s) 401, and a channel layer 402 formed from GaN. The layer stack of FIG. 4 also includes an Aluminum Nitride (AlN) etch stop layer (or spacer) 405, as well as a barrier layer 410. The barrier layer 410 causes the 2DEG 404 to be present within the layer stack. In some implementations, the channel layer 402 may be on the order of several hundred nanometers thick, e.g., approximately 300 nm thick. The AlGaN barrier layer 410 may be on the order of tens of nanometers thick, such as in a range of approximately 35-50 nm, e.g., 40 nm. In example implementations, the AlGaN barrier layer 410 may be doped with approximately 15% Al. The structure of FIG. 4 may be formed, e.g., in a metal organic chemical vapor deposition (MOCVD) process, and may be formed in accordance with process step 902 of FIG. 9.

Figure 5:
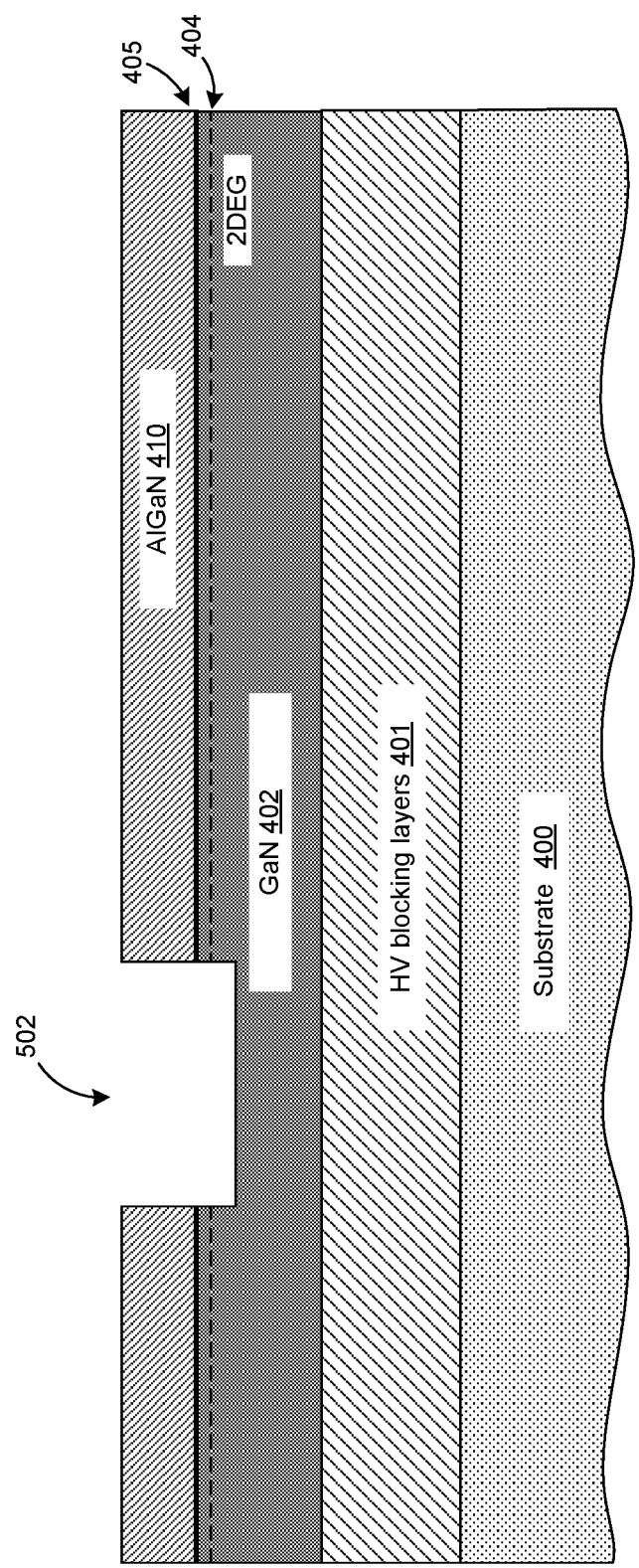
FIG. 5 illustrates a second example intermediate device structure for forming an implementation of the E-mode MISHEMT with GaN channel regrowth under a gate area of FIG. 1.

In FIG. 5, a mask and etch process may be implemented to form a recess 502 (e.g., a trench) through the barrier layer 410 and into the channel layer 402, in accordance with process step 904 of FIG. 9. For example, the etch stop layer 405 may be used during a first etching process, e.g., in a Flourine chemistry, to provide a precise stop of the etching of the barrier layer 410.

Then, a second, wet etch may be implemented and used to remove the portion of the etch stop layer 405 within the recess 502. A third, digital etch may be used to etch the channel layer 402. For example, digital etching may occur at approximately 1.1 nm/cycle of digital etching, so that, for example, 4-5 cycles of etches about 4.4-5.5 nm into the channel layer 402.

Figure 6:
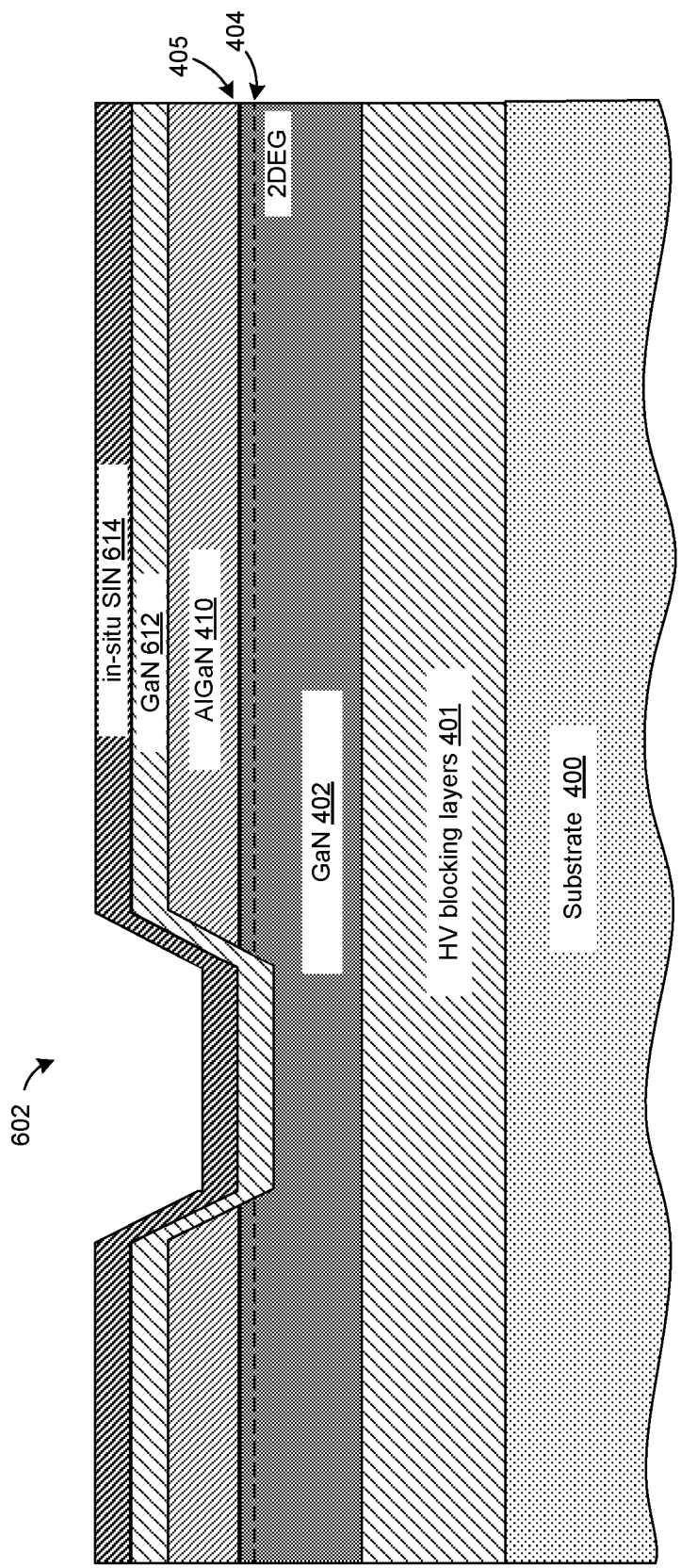
FIG. 6 illustrates a third example intermediate device structure for forming an implementation of the E-mode MISHEMT with GaN channel regrowth under a gate area of FIG. 1.

In FIG. 6, growth of channel-material layer 612 and SiN layer 614 within the recess 502 may be performed in-situ, in accordance with process step 906 of FIG. 9. For example, MOCVD regrowth of GaN may be performed to obtain the channel-material layer 612, and, during a single reactor step, the SiN layer 614 may be grown, as well.

As referenced, forming the SiN layer 614 during a same high-temperature process step, without risking contamination that may be associated with removal and reinsertion from/into a reactor, provides a very high quality interface, particularly since both GaN and SiN are binary systems. Further, washout operations during MOCVD will result in the illustrated tapering of a gate profile, which e.g., facilitates later formation of the gate.

In example implementations, a depth of the channel-material layer 612 may be a minimal depth needed to ensure disruption of the 2DEG 404. Forming the channel-material layer 612 beyond this minimal depth may result in slower switching speeds and other potential negative effects, due to unnecessary lengthening of the current channel (e.g., including current channel 120 of FIG. 1).

For example, the channel-material layer 612 may be grown at a thickness that is approximately similar to the 2DEG 404 itself and/or a thickness of the digital etching of the channel layer. For example, the channel-material layer 612 may be grown at a thickness on the order of a few nanometers, e.g., about 5 nm. The SiN layer or other passivation layer may be set to a thickness determined to optimize the above-referenced advantages of, e.g., surface passivation and low interface state density.

In some implementations, the channel-material layer 612 may be p-doped (e.g., Magnesium). Inclusion of such pGaN in the channel-material layer 612 may provide an increase in the threshold voltage Vth. Further examples of including pGaN in the channel-material layer 612 are provided below, with respect to FIG. 8.

Figure 7:
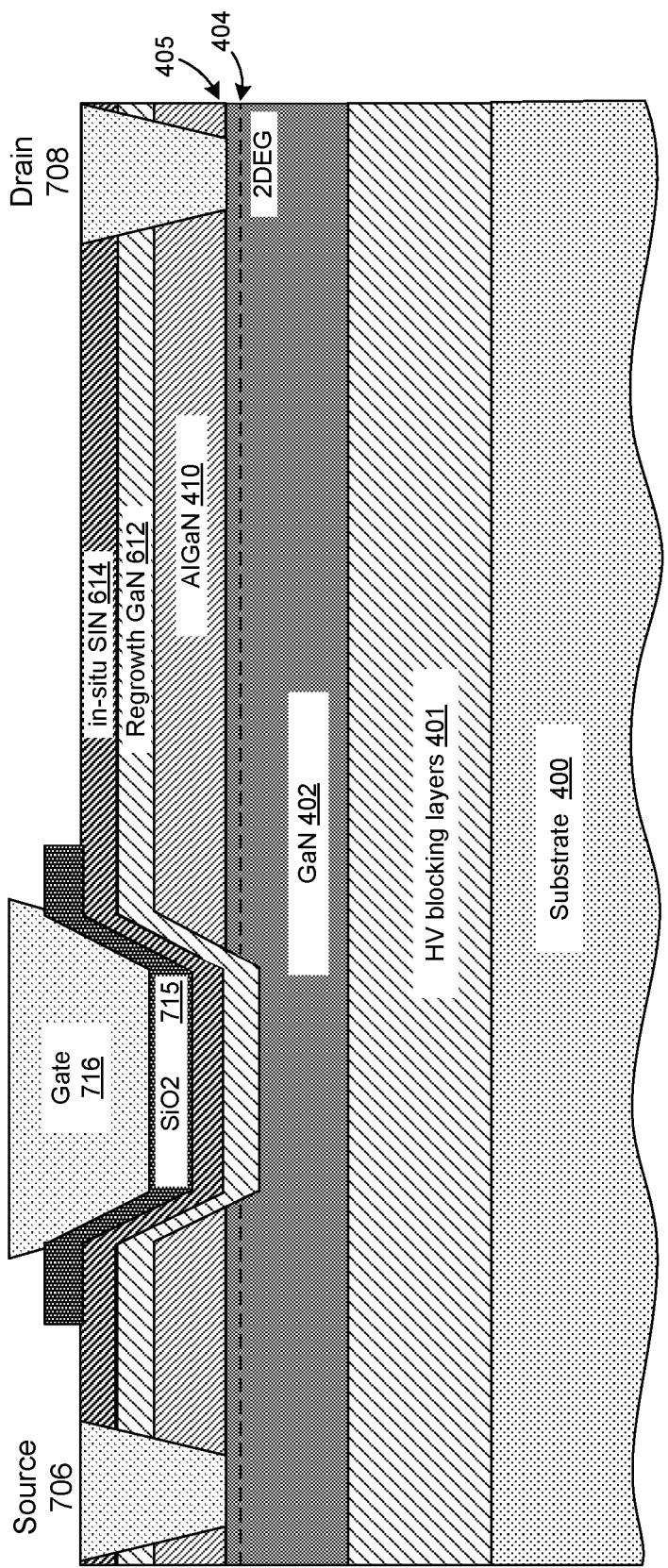
FIG. 7 illustrates a fourth example intermediate device structure for forming an implementation of the E-mode MISHEMT with GaN channel regrowth under a gate area of FIG. 1.

In FIG. 7, a second dielectric (e.g., oxide) layer 715 is formed, as well as source 706 drain 708 (ohmic contacts; may require annealing), and gate 716 (gate metal, polysilicon, or other gate conductor), in accordance with process step 908 of FIG. 9. The gate 716 can be formed within a gate trench or gate recess 602. For example, a $SiO_2$ layer may be formed in a plasma enhanced chemical vapor deposition (PECVD) process. In further examples, the second dielectric 715 may be implemented as a stack of dielectrics. Layer 715 may be overlaying 614 totally.

Figure 8:
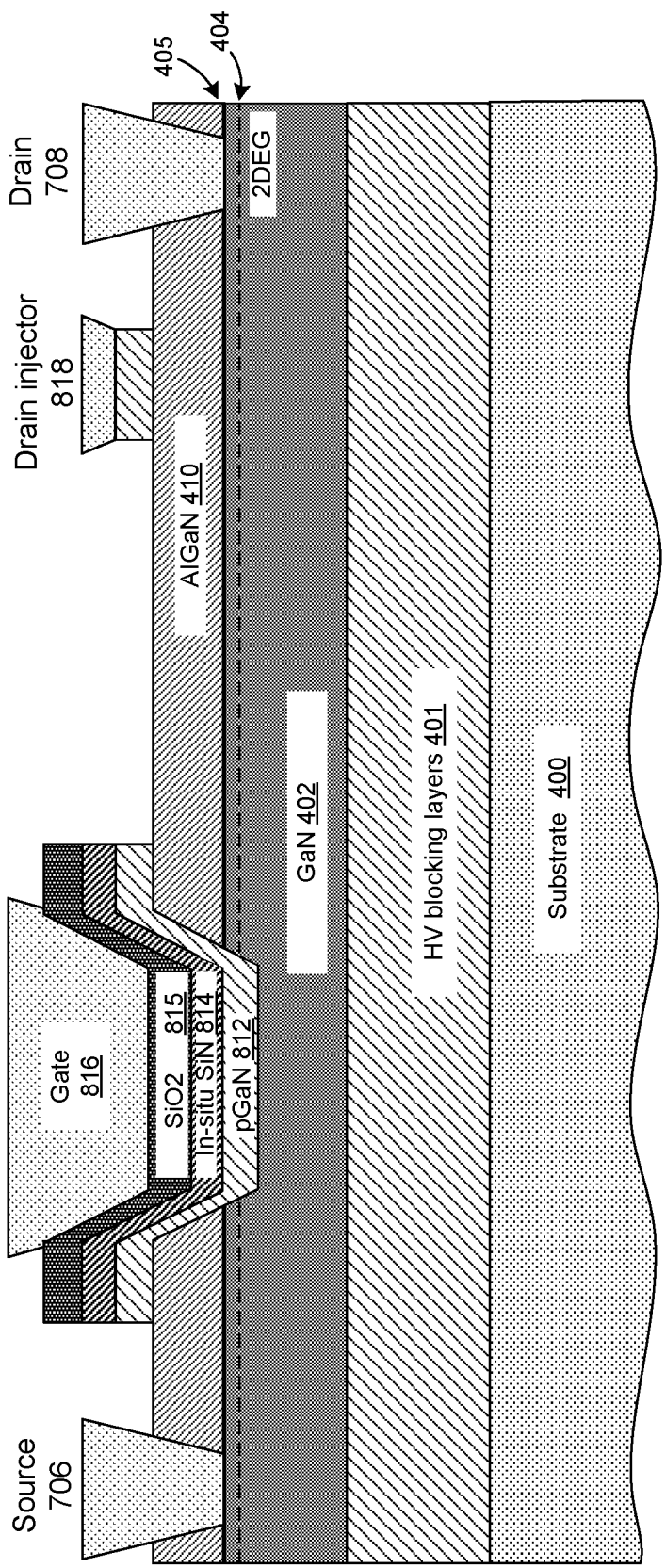
FIG. 8 illustrates a fifth example device structure for forming an implementation of the E-mode MISHEMT with GaN channel regrowth under a gate area of FIG. 1.
Figure 9:
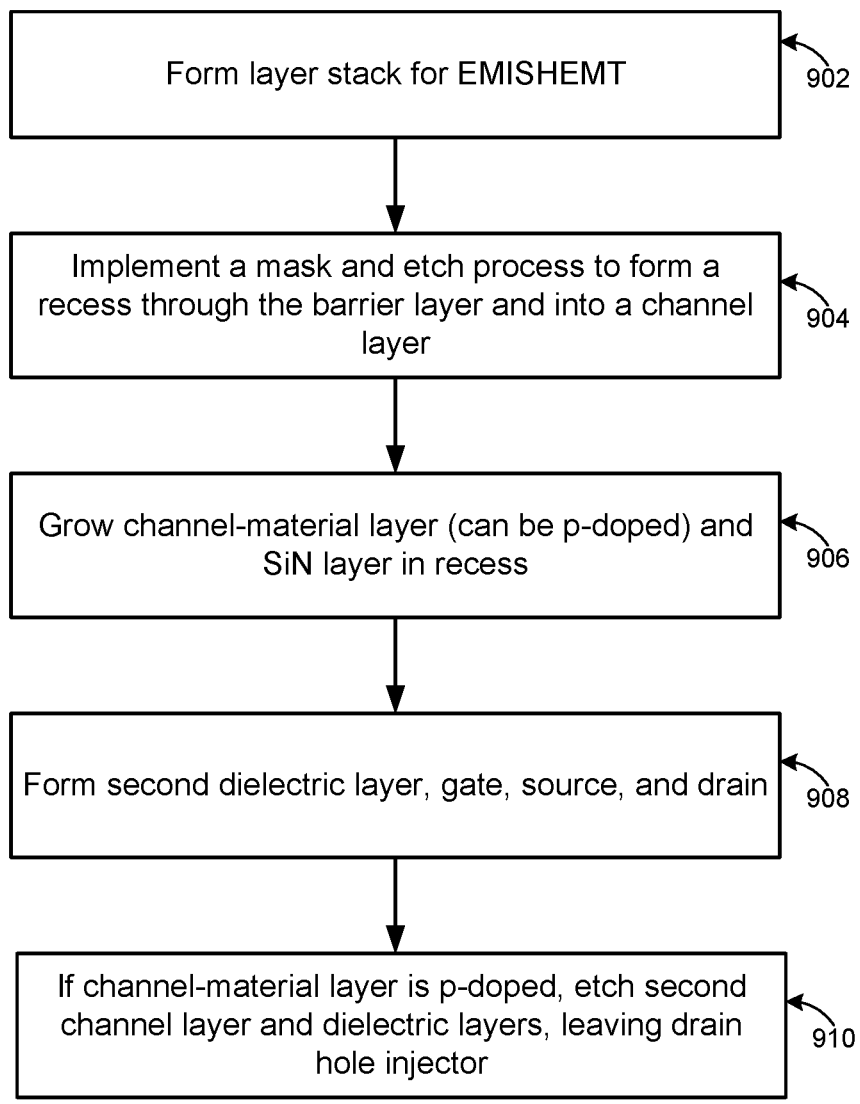
FIG. 9 is a flowchart illustrating an example process for forming an implementation of the E-mode MISHEMT with GaN channel regrowth of under a gate area FIG. 1, in accordance with FIGS. 4-8.

In FIG. 8, as referenced with respect to FIG. 6, and included in FIG. 9 as process step 910, the channel-material layer is illustrated as pGaN channel-material layer 812. In this example, the channel-material layer 812, in-situ SiN layer 814, and $SiO_2$ layer 815 may be selectively etched outside of the gate 816 area, but leaving a drain hole injector 818. Such a hole injector may, e.g., provides holes to compensate any trapped electrons, as well as providing electric field modulation in a vicinity of the drain 708.

In some example implementations, various parameters and aspects discussed above may be adjusted or selected to obtain a desired effect. For example, increasing a thickness of the SiN layer 214 (FIG. 2), 614 (FIG. 6), or 814 (FIG. 8) may result in a higher Vth, but with a relatively more gradual turn-on characteristic.

Figure 10:
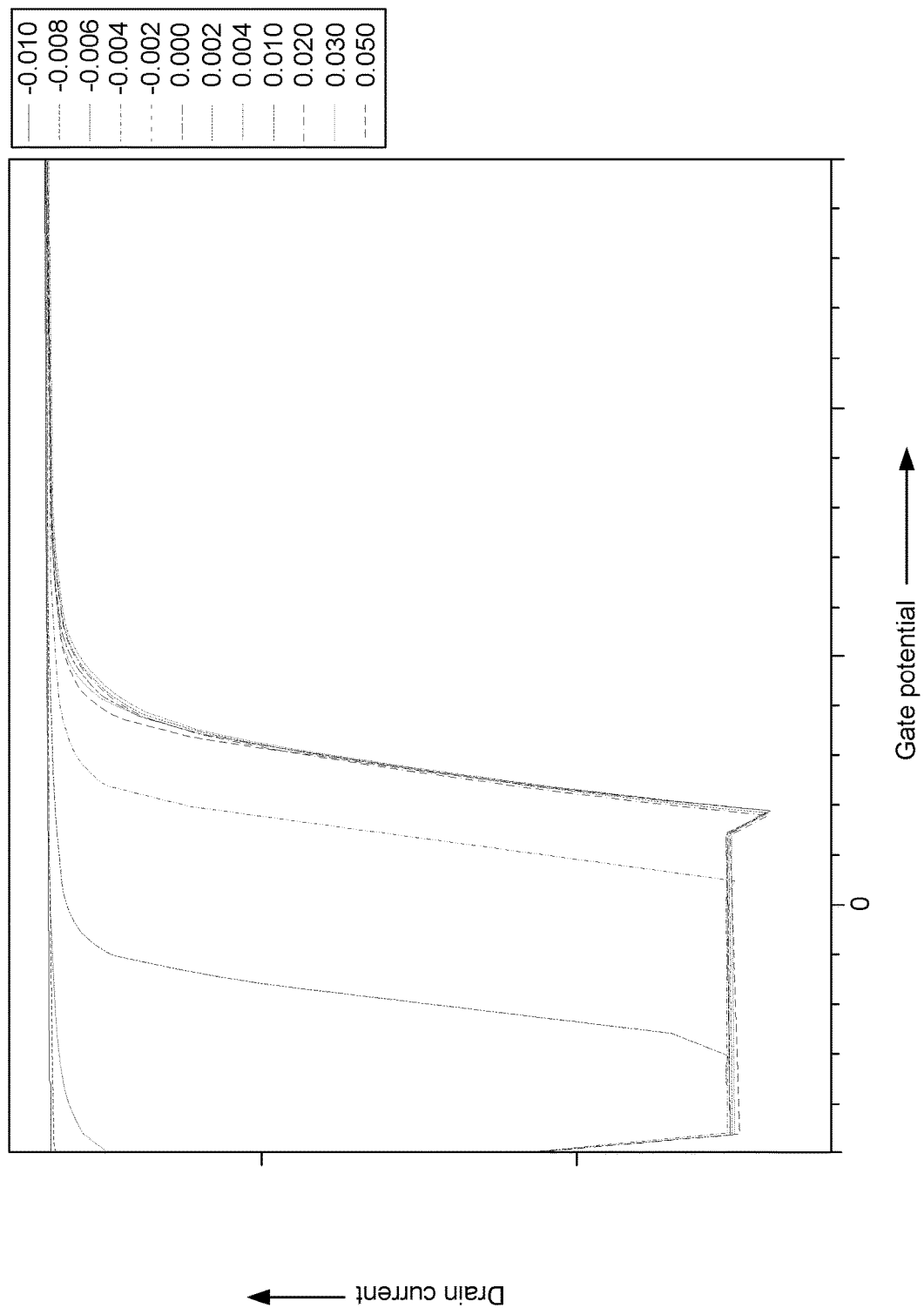
FIG. 10 is a graph illustrating a drain current as a function of gate potential for example embodiments.

FIG. 10 is a graph illustrating drain current vs. gate voltage as a function of a recess depth of the channel-material layer (e.g., 112 in FIG. 1) through the barrier layer (110 in FIG. 1) and into the channel layer (e.g., 102 in FIG. 1). In FIG. 10, a recess depth between −0.010 microns and −0.002 microns corresponds to leaving a corresponding amount of the barrier layer intact, while recess depths between 0.002 and 0.050 microns corresponds to formation of the portion 118 of FIG. 1 within the channel layer 102.

As shown, leaving the barrier layer 110 partially intact may result in unsatisfactory turn-on characteristics, since drain current may occur near or below 0V. On the other hand, formation of the channel-material layer at least partially within the channel layer, with no portion of the barrier layer remaining intact between the two channel layers, provides a positive turn-on voltage (i.e., E-mode operation) with desired turn-on characteristics.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to. In some implementations, adjacent can include a first element being in contact with or direct contact with a second element (e.g., without an intervening element between the first element and the second element).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device, comprising:
a High Electron Mobility Transistor (HEMT) having:
   a substrate;
   a channel layer adjacent to the substrate;
   a barrier layer adjacent to the channel layer and extending at least partially between a source and a drain of the HEMT, the barrier layer providing a heterojunction with the channel layer, the heterojunction causing a two-dimensional electron gas (2DEG) to occur within the channel layer between the source and the drain;
   a channel-material layer extending through a recess in the barrier layer and into the channel layer, the channel-material layer including a channel-material portion that is within the channel layer and between the barrier layer and the substrate;
   at least one passivation layer adjacent to the channel-material layer within the recess;
   at least one dielectric layer adjacent to the at least one passivation layer within the recess; and
   a gate adjacent to the at least one dielectric layer,
   wherein the channel-material portion disrupts the 2DEG when the gate is not biased and defines a disruption region between the channel-material portion and the substrate, and current flows between the source and the drain through the disruption region when a bias is applied to the gate.

2. The semiconductor device of claim 1, wherein the channel-material layer formed within the recess in the barrier layer extends along a surface of the barrier layer in a direction of a source contact of the HEMT and in a direction of a drain contact of the HEMT.

3. The semiconductor device of claim 2, wherein the at least one passivation layer extends along a surface of the channel-material layer in the direction of the source contact of the HEMT and in the direction of the drain contact of the HEMT.

4. The semiconductor device of claim 3, wherein the at least one dielectric layer includes portions extending substantially parallel to sidewalls of the recess, and extends along a surface of the at least one passivation layer in the direction of the source contact of the HEMT and in the direction of the drain contact of the HEMT.

5. The semiconductor device of claim 4, wherein the at least one passivation layer includes silicon nitride.

6. The semiconductor device of claim 4, wherein the at least one dielectric layer includes an oxide having a bandgap offset relative to both a conduction band and a valence band of the channel layer and the channel-material layer.

7. The semiconductor device of claim 1, wherein the channel-material layer is p-doped.

8. A High Electron Mobility Transistor (HEMT) device, comprising:
   a substrate;
   a channel layer adjacent to the substrate;
   a barrier layer adjacent to the channel layer and forming a heterojunction therewith, the heterojunction causing a two-dimensional electron gas (2DEG) to occur within the channel layer;
   a channel-material layer formed at least partially within a recess in the barrier layer and including a portion that extends into the channel layer;
   at least one passivation layer adjacent to the channel-material layer within the recess;
   at least one dielectric layer adjacent to the at least one passivation layer within the recess;
   a gate adjacent to the at least one dielectric layer; and
   a source and a drain formed at opposing ends of the 2DEG to define a current channel between the source and the drain that extends through the channel layer, the current channel including a region of the channel layer adjacent to the portion of the channel-material layer,
   wherein the channel-material layer, the at least one passivation layer, and the at least one dielectric layer extend in a direction of the source and in a direction of the drain, wherein the portion of the channel-material layer disrupts the 2DEG when the gate is not biased and defines a disruption region between the portion of the channel-material layer and the substrate, and current flows between the source and the drain through the disruption region when a bias is applied to the gate.

9. The HEMT of claim 8, wherein the channel-material layer extends along sidewalls of the recess.

10. The HEMT of claim 8, wherein the at least one dielectric layer includes an oxide having a bandgap offset relative to both a conduction band and a valence band of the channel layer and the channel-material layer.

11. The HEMT of claim 10, wherein the at least one passivation layer includes Silicon Nitride.

12. The HEMT of claim 8, wherein the substrate includes a Sapphire substrate.

13. The HEMT of claim 8, wherein the channel-material layer is p-doped.

14. The semiconductor device of claim 1, wherein the channel-material portion has a thickness of less than 10 nm.

15. The semiconductor device of claim 1, wherein the channel layer and the channel-material layer include the same channel material.

16. The semiconductor device of claim 15, comprising a drain hole injector adjacent to the barrier layer between the gate and a drain contact, the drain hole injector including the channel material.

\* \* \* \* \*